United States Patent [19]

Volpe et al.

[11] 4,393,352
[45] Jul. 12, 1983

[54] SAMPLE-AND-HOLD HYBRID ACTIVE RC FILTER

[75] Inventors: Gerald T. Volpe, Stamford; Leonard S. Laskoski, Bridgeport; Ralph J. Amodeo, Bethel; William J. Swanson, Danbury; Jerome D. Gottesman, Norwalk, all of Conn.

[73] Assignee: The Perkin-Elmer Corporation, Norwalk, Conn.

[21] Appl. No.: 188,429

[22] Filed: Sep. 18, 1980

[51] Int. Cl.³ .............................................. H03D 1/02
[52] U.S. Cl. ...................................... 329/50; 328/167; 329/101; 329/145; 329/169; 329/178; 455/337
[58] Field of Search .................. 329/50, 101, 122, 136, 329/145, 168, 169, 178; 455/201, 203, 214, 337; 328/165, 167, 151; 333/173, 176

[56] References Cited

U.S. PATENT DOCUMENTS

| | | | |
|---|---|---|---|
| 3,411,092 | 11/1968 | Ronne | 329/50 X |
| 3,621,402 | 11/1971 | Gardner | 328/167 X |
| 3,761,816 | 9/1973 | Condon | 333/173 X |
| 4,253,066 | 2/1981 | Fisher et al. | 329/50 |
| 4,292,594 | 9/1981 | David et al. | 329/50 |

Primary Examiner—Siegfried H. Grimm
Attorney, Agent, or Firm—S. A. Giarratana; E. T. Grimes; T. P. Murphy

[57] ABSTRACT

A discrete-time analog filter for eliminating a variable frequency carrier of an amplitude-modulated signal. The filter comprises a plurality of unit delay circuits, each of which is sampled at a rate which varies in proportion to the frequency of the carrier so as to automatically tune the filter's reject band to follow the carrier frequency.

6 Claims, 6 Drawing Figures

SAMPLE-AND-HOLD HYBRID ACTIVE RC FILTER

The government has rights in this invention pursuant to Contract No. F29601-78-C-004 awarded by the Air Force Contracting Center, Kirtland Air Force Base, N.M. 87117.

BACKGROUND OF THE INVENTION

Various techniques are available for eliminating the carrier frequency of an information carrying amplitude modulated signal. Such filters find common use in communication systems such as radio and television as well as many other systems where it is desired to reject a band of frequencies.

One type of filter involves simple R-C circuits and operational amplifiers in various forms. For example, an amplifier with resistance connected from the source to its input and a capacitor connected in parallel between the input and output of the amplifier may, for any frequency or more precisely for a band of frequencies, reduce a desired band of high frequencies. Such a circuit is called an active integrator and is used quite commonly. The attenuated band of frequencies is fixed by the selected parameters. If another band of frequencies is to be rejected, the values of the components must, of course, be changed to provide the desired response.

Another type of filter is a band reject filter which may be comprised of two integrators in tandem each acting as a delay to give phase lag and lead at frequencies determined by the parameters of the circuits, and by combining the lead and lag voltages will null out or reject a frequency or band of frequencies.

Innovations in the field of filters has also resulted in the use of digital filters wherein an input signal is sampled and delayed at rates dependent on the sampling period. The actual sampling rate in these digital filters determines the band pass or passband reject band of frequencies. In such filters sampling the input signal provides the delay just as the integrator circuits provide lag in the first two types of filters discussed above. Such filters are discussed in a textbook entitled "Digital Filters and Their Applications" by V. Cappellini, et al., Academic Press, 1978.

Thus, if a particular incoming signal has a carrier whose frequency varies due to some phenomenon, the frequency which it is desired to reject will change. Since the above discussed filters are tuned for one frequency, they are inherently not capable of rejecting the frequency caused by variation in the frequency of the input signal.

The present invention overcomes this problem.

SUMMARY OF THE INVENTION

The present invention relates to a band reject filter having a notch frequency which automatically tracks the variable frequency of the input carrier signal. Essentially the filter of the present invention is an active resistance-capacitor type which is sampled at a rate proportional to the frequency variations of the input signal. The filter of the present invention comprises a plurality of tandemly connected sample-and-hold circuits which are strobed at a rate dependent on the frequency of the carrier. The filter of the present invention also includes two feedback and three feedforward loop resistors whose values are chosen to form the appropriate coefficient weights. Each of these resistances plus an input resistance uniquely controls a specific filter parameter without interaction as is usual in conventional filter design.

DESCRIPTION

Figure 1:
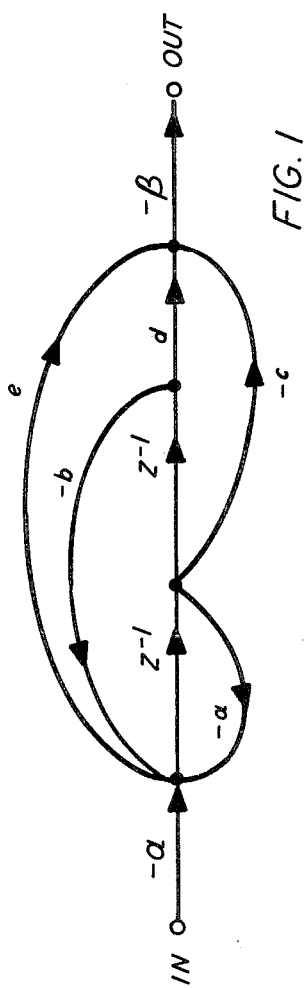
FIG. 1 shows a linear signal flow graph for the circuits of FIG. 2.
Figure 2:
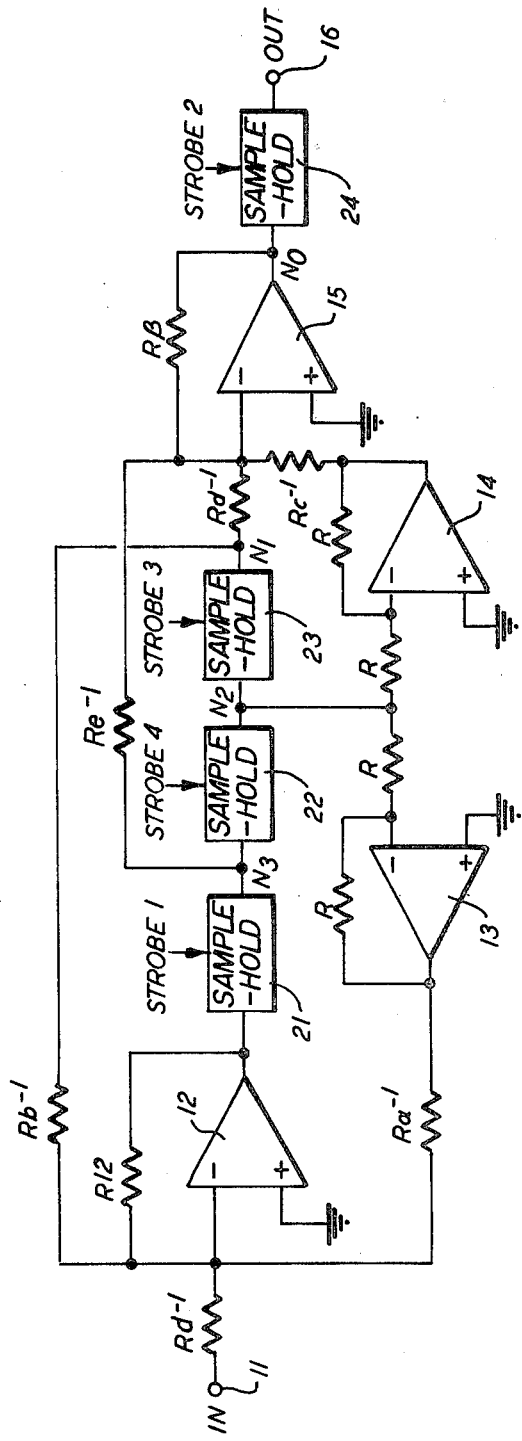
FIG. 2 illustrates a schematic/block diagram of the filter of the present invention.

FIG. 1 is a linear signal flow diagram illustrative of signal flow in the filter of FIG. 2.

The feedback loops and feedforward paths defined by appropriate resistances independently control the transfer functions of the system (output/input vs. frequency). Thus, the filter's natural frequency is controlled by b, i.e., by the resistor $Rb^{-1}$ in the outer negative feedback loop. The quality factor or damping of the filter is controlled by a, i.e., by the resistor $Ra^{-1}$ in the inner positive feedback loop. The notch frequency is controlled by d, i.e., by the feedforward resistor $Rd^{-1}$. The notch depth is controlled by c, i.e., by feedforward resistor $Rc^{-1}$. The d.c. gain $H_{(o)}$ and signal level dynamic range of the filter is controlled by the resistors $Ra^{-1}$ and $R_B$. These parameters are summarized in Table I.

Referring now more particularly to FIG. 2, there is shown the filter of the present invention. It comprises a differential amplifier 12. The amplifier 12 has an input terminal 11 connected to the negative or inverting input of differential amplifier 12 through resistor $Rda^{-1}$. The amplifier 12 has a feedback resistance R12 connected between the output and input of amplifier 12.

The output of amplifier 12 is connected to the input zero-order-hold or sample and hold circuit 21. The output of sample-and-hold circuit 21 is connected to the input of sample-and-hold circuit 22 whose output is connected to the input of sample-and-hold circuit 23. The output node N1 of sample-and-hold circuit 23 is connected to the input of amplifier 12 in a negative feedback connection through resistor $Rb^{-1}$. This loop is the degenerative feedback loop of the system that controls the filter's natural or center frequency.

The output node N2 of sample-and-hold circuit 22 is connected via positive feedback loop to the input of amplifier 12 through resistor $Ra^{-1}$. This connection is made through the inverting or negative input of differential amplifier 13 so as to provide quality factor or damping control.

The output node N2 of samplel-and-hold circuit 22 is also connected via the inverting input of amplifier 14 and resistor $Rc^{-1}$ to the inverting input of amplifier 15. This connection controls the notch depth.

The output node N1 of samplel-and-hold 23 is connected to the inverting input of amplifier 15 in the feedforward path through resistor $Rd^{-1}$, which controls the notch frequency.

The output N3 of sample-and-hold circuit 21 is also connected to the inverting input of amplifier 15 through resistor $Re^{-1}$. Resistor $Re^{-1}$ is a feedforward resistor which provides cancellation of the in-phase component of the signal that may be left over after quadrature cancellation.

The amplifiers 13 and 14 function only to change the signs of their respective inputs to provide the appropriate signs of coefficients. The unnumbered feedback and input resistors are equal and provide a gain of $-1$.

The amplifiers 12 and 15 provide the weighted summing operation of the invention. The amplifier 12 sums the input signal and the negative feedback signals to provide control of the feedback loop which controls the frequency response characteristics of the filter by adjusting cut-off frequency and quality factor.

The amplifier 15 performs the summing in the filter output to obtain the desired null or notch characteristic by voltage vector cancellation.

The input resistor $R\alpha^{-1}$, which is connected directly to the input of amplifier 12, is chosen so as to enable the signal to attain its maximum value without creating saturation of any of the amplifiers within the circuit of FIG. 1.

The output of amplifier 15 is fedback to its input via resistor $R\beta$ which scales the overall gain to unity. The output of amplifier 15 is connected to the output of sample and hold circuit 24. The output terminal of sample-and-hold circuit 24 provides the desired filtered output of the filter.

As indicated each of the sample-and-hold circuits 21, 22, 23 and 24 is strobed by pulses generated and timed in a manner to be described herein below. The frequency at which the sample and hold circuits 21, 22, 23 and 24 are strobed determines the band reject or notch frequency for which the filter is tuned.

As will be seen more clearly herein below, variation in the strobe rate causes the notch frequency of the filter to change. Thus, by varying the frequency of the strobe pulses in proportion to the variations in the carrier frequency the notch frequency is caused to track the carrier frequency. This insures that the filter is always appropriately tuned to eliminate the carrier frequency leaving only the information carrying envelope.

Figure 4:
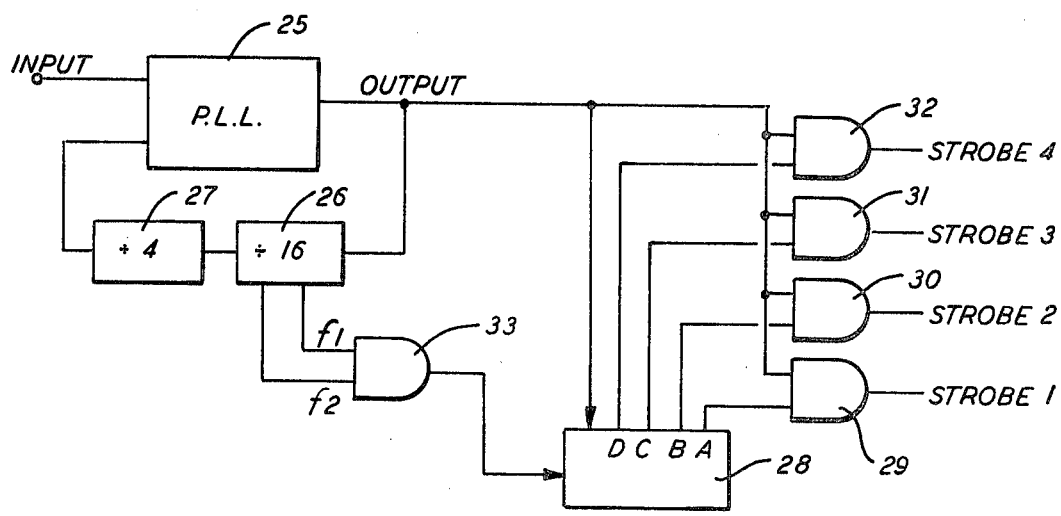
FIG. 4 illustrates a timing generator for providing the strobe pulses used by the filter of FIG. 2.

FIG. 4 illustrates the strobe pulse generator used in conjunction with the filter of FIG. 1. It generates four strobes which together form a period T, defined by the reciprocal of the carrier frequency. Therefore, as previously pointed out, the period of the strobe will follow the carrier "frequency period".

The strobe pulse generator of FIG. 4 comprises a phase-locked-loop 25, e.g., Model NE564 obtainable from the Signetics Corporation. The input to the phase locked loop 25 is the signal containing the variable carrier frequency to be rejected. The output of the phase-locked-loop 25 is fed back to its input via tandem frequency divider 26 and 27 which divides the output frequency by 64 thereby causing the output frequency of 25 to be 64 times the input.

This output provides the clock which is connected to a four stage shift register 28 and as one input to each of AND gates 29, 30, 31, and 32.

In addition to the divide-by-sixteen output of divider 26, two additional output terminals are fed to AND gate 33. The first output terminal provides an input to AND gate 33 which is the output frequency of the phase-locked-loop 25 divided by two or thirty-two times the input frequency. The second output terminal provides an input to AND gate 33 which is the output frequency of the phase-locked-loop 25 divided by four or sixteen times the input frequency.

These two outputs are AND ed in AND gate 33 causing the shift register 28 to provide output pulses A, B, C, and D from the shift register at the clock rate which is 64 times the input frequency. These output pulses are provided to AND gates 29, 30, 31 and 32 where they are gated by the clock pulses to provide the four strobe pulses spaced one quarter of the period T.

The phase-locked-loop 25 consists essentially of a phase detector which compares the frequency of a voltage-controlled-oscillator with that of the carrier input. The output of the phase detector is fed back to the voltage-controlled-oscillator to keep it exactly in phase with the input frequency. Thus, the output of the phase-locked-loop 25 is a frequency which precisely follows the input frequency making it possible to use it as the clock to generate the strobes for the sample-and-hold circuits whose frequency varies with the input carrier frequency.

Figure 5:
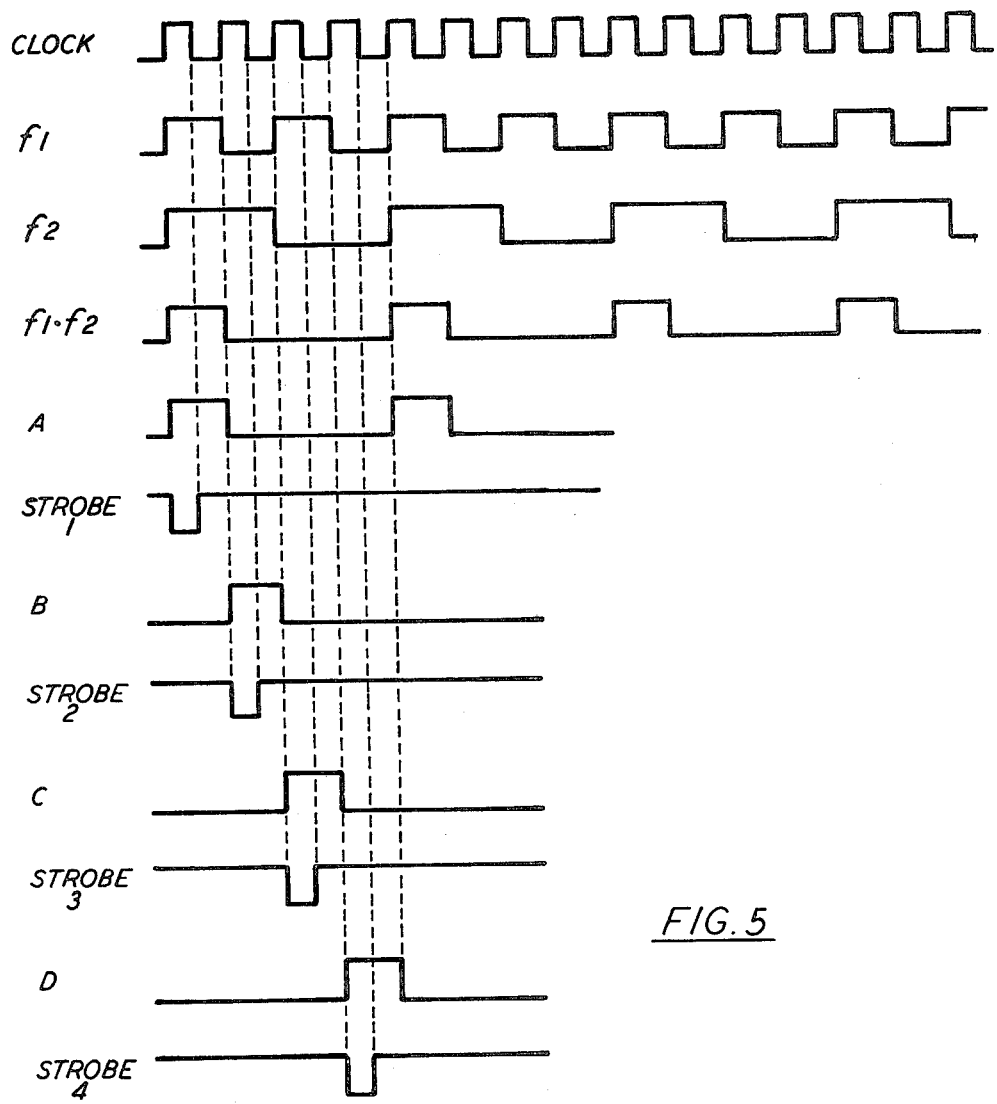
FIG. 5 is a timing diagram useful in explaining the timing generator of FIG. 4.

FIG. 5 shows a timing diagram illustrative of the operation of the timing generator of FIG. 4.

The first line of the diagram of FIG. 5 represents the clock pulse which is the input carrier frequency squared and multiplied by sixty four.

The second line is the first input $f_1$ into AND gate 33.

The third line is the second input to AND gate 33.

The fourth line is the output $f_1 \cdot f_2$ from the AND gate.

The fifth line is the output from shift register 28 which is fed to AND 29 to form with a clock pulse the first strobe pulse or strobe 1 shown in the sixth line of the timing diagram. The purpose of AND ing the output of the shift register 28 with a clock pulse is to provide strobe pulses which are separated to avoid the possibility of overlapping. This is easily seen from the timing diagram of FIG. 5.

Also, as seen from the timing diagram, strobe 2 is obtained by AND ing the B output of shift register 28 with a clock pulse.

Strobes 3 and 4 are obtained by AND ing the C and D output pulses from the shift register 28 with succeeding clock pulses. This cycle continues with four strobes being generated with a period T. By using the input carrier frequency to form the clock pulses and therefore, the timing base, it is seen that the frequency or period of each set of strobes follows the carrier frequency. These strobes gate the sample-and-hold-circuits 21, 22, 23 and 24. Strobes 1 and 2 gate sample-and-hold-circuits 21 and 24, respectively. Strobes 3 and 4 gate sample and hold circuits 23 and 22, respectively. The sequence is chosen as follows:

(a) Strobe 1 samples the input and associated feedback voltages at nodes N2, N1 at time $t=NT$, into sample-and-hold circuit 21 (where N is an arbitrary integer).

(b) Strobe 2 outputs any previously held data in sample-and-hold-circuit 24 at time $t=(N+0.25)T$.

(c) Strobe 3 causes sample-and-hold circuit 23 to deliver its output to sample-and-hold circuit 24 via. amplifier 15 at time $t=(N+0.5)T$, thereby enabling sample-and-hold circuit 23 to receive data from sample-and-hold circuit 22 one period later at time $t=(N+1.5)T$.

(d) Strobe 4 enables sample-and-hold circuit 22 to receive the output of sample-and-hold circuit 21 at time $t=(N+0.75)T$. This voltage was stored in sample-and-hold circuit 21 at time $t=NT$ and is therefore T seconds old or delayed.

Figure 3:
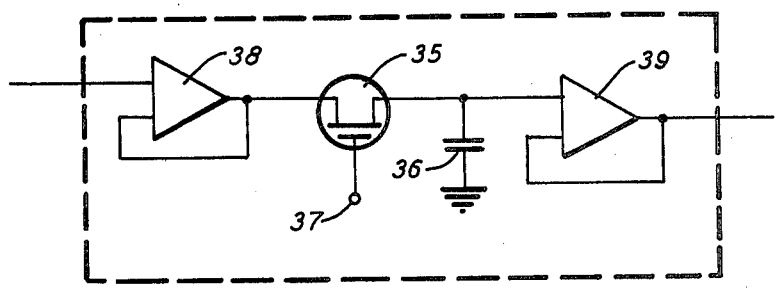
FIG. 3 illustrates a typical sample-and-hold circuit capable of being used in the present invention.

FIG. 3 illustrates the essential elements of a typical sample-and-hold circuit. It comprises an electronic switch, i.e., a field effect transistor 35 of the MOS type, a capacitor 36 connected between the MOSFET transistor 35 and ground, and two buffer amplifiers 38 and 39. The transistor 35 is normally open so that when it is pulsed by a strobe it closes to quickly charge the capacitor 36 which retains the charge or voltage of the signal after the strobe vanishes. When the transistor 35 is strobed again one period later the capacitor 36 charges or discharges to the voltage level of the input signal at the new instant of sampling.

A feature of the present invention is that the capacitors of each of the sample-and-hold circuits are equal which is not the case in other type filters. This feature makes the filter compatible to IC design. The feedback and feedforward weighting resistors can be external to the filter as a chip, and are user-selectable to allow almost any specific filter characteristic.

For the purpose of explanation specific parameters of the filter have been chosen. It should be noted, however, that other values may be selected to provide different frequency response characteristics.

The sampling rate is chosen to be 16 times the nominal notch frequency to provide a sufficient number of samples per data period. The following specifications have also been chosen for purposes of explanation and were used in a practical embodiment:

notch frequency = 13.5 kHz
quality factor = 1
d.c. gain or H(o) = 1
signal level = 20 volts, peak-to-peak.

A straightforward analysis of FIG. 2 yields the biquadratic Z- transformed transfer function.

$$H(z) = H_o \left( \frac{ez^2 - cz + d}{z^2 - az + b} \right) \quad (1)$$

where $H_o = \alpha\beta$ and a, b, c, d and e have been previously defined.

For the notch filter which was designed, the second-order frequency domain transfer function, H(S), is known to be $$H(S) = \frac{H_o s^2 + \omega_o^2}{s^2 + \frac{\omega_o}{Q} s + \omega_o^2} = \frac{s^2 + \omega_o^2}{s^2 + 2\xi\omega_o s + \omega_o^2} \quad (2)\ (6).$$

where $W_O$ is $2\pi$ times the notch frequency and $\xi$ is the damping ratio equal to one half of the inverse of the quality factor. Eq (2) may be factored to $$H(S) = \frac{H_o(s + j\omega_o)(s - j\omega_o)}{(s + \xi\omega_o + j\omega_o\sqrt{1 - \xi^2})(s + \xi\omega_o - j\omega_o\sqrt{1 - \xi^2})} \quad (3)$$

The numerator factors are the zeros and the denominator factors are the poles.

Using the transformation $z = e^{sT}$ maps the zeros and poles from the S-plane to the z-plane, forming the pulsed transfer function.

$$\frac{H(z)}{H_o} = \frac{(z - e^{-j\omega_o T})(z - e^{j\omega_o T})}{(z - e^{-\xi\omega_o T}\exp{-j\omega_o\sqrt{1 - \xi^2}T})(z - e^{-\xi\omega_o T}e^{j\omega_o}\exp{j\omega_o T\sqrt{1 - \xi^2}})} \quad (4)$$

If the factors are multiplied together in the numerator and denominator the result is $$\frac{H(Z)}{H_o} = \frac{Z^2 - Z(2\cos\omega_o T) + 1}{z^2 - ze^{-\xi\omega_o T}(2\cos\omega_o T\sqrt{1 - \xi^2}) + e^{-2\xi\omega_o T}} \quad (5)$$

which possesses real coefficients.

Comparing equation (5) with equation (1) reveals the design parameters for the filter resistors:

$a = 2e^{-\xi\omega_o T}\cos(\omega_o T\sqrt{1 - \xi^2})$ $b = e^{-2\xi\omega_o T}$ $c = 2\cos\omega_o T$ $d = 1$ $e = 1$ $\alpha\beta = H_o$ The reciprocals of these a, b, c, d, and e parameters are the fixed resistor values scaled by a convenient constant. As a result, $\omega_o T$ is equal to a constant. Herein lies the tracking ability of the filter. As stated earlier $$f\text{(sampling)} = \frac{1}{T} = 16 f_o = 16 \left( \frac{\omega_o}{2\pi} \right)$$

so that $$\omega_o T = \frac{\pi}{8} \quad (7)$$

Therefore, as T increases, $\omega_o$ will automatically decrease keeping the product $\omega_o T$ equal to a constant. From the specification, $\omega_o = 2\pi(13.5 \text{ KHz}) = 84825 \text{ rad/sec}$ and $Q = 1, \xi = 0.5$ which when substituted into equation (5) yields:

$$H(Z) = H_o \left( \frac{z^2 - 1.848z + 1}{z^2 - 1.549z + 0.6752} \right) \quad (8)$$

At dc, which corresponds to $z = 1$, the transfer function is to have a gain of unity. But $H(1) = 1.204$ and therefore a scale factor of $H_o = 1/1.204 = 0.8306$ must be incorporated into eq. (8) or $$H(Z) = 0.8306 \left[ \frac{z^2 - 1.848z + 1}{z^2 - 1.549z + 0.6752} \right] \quad (9)$$

This transfer function allows us to assign values to a, b, c, d, e, and select resistor values for the circuit in FIG. 1. With R = 10K, to minimize offsets in the op-amps, $Ra^{-1} = 6.46$ Kohms
$Rb^{-1} = 14.81$ Kohms
$Rc^{-1} = 5.41$ Kohms
$Rd^{-1} = 10$ Kohms
$Re^{-1} = 10$ Kohms
$R\alpha^{-1} = 10$ Kohms
$R\beta = 8.306$ Kohms (Closest standard 1% values were used)

WAVEFORM DESCRIPTION OF OPERATION

Figure 6:
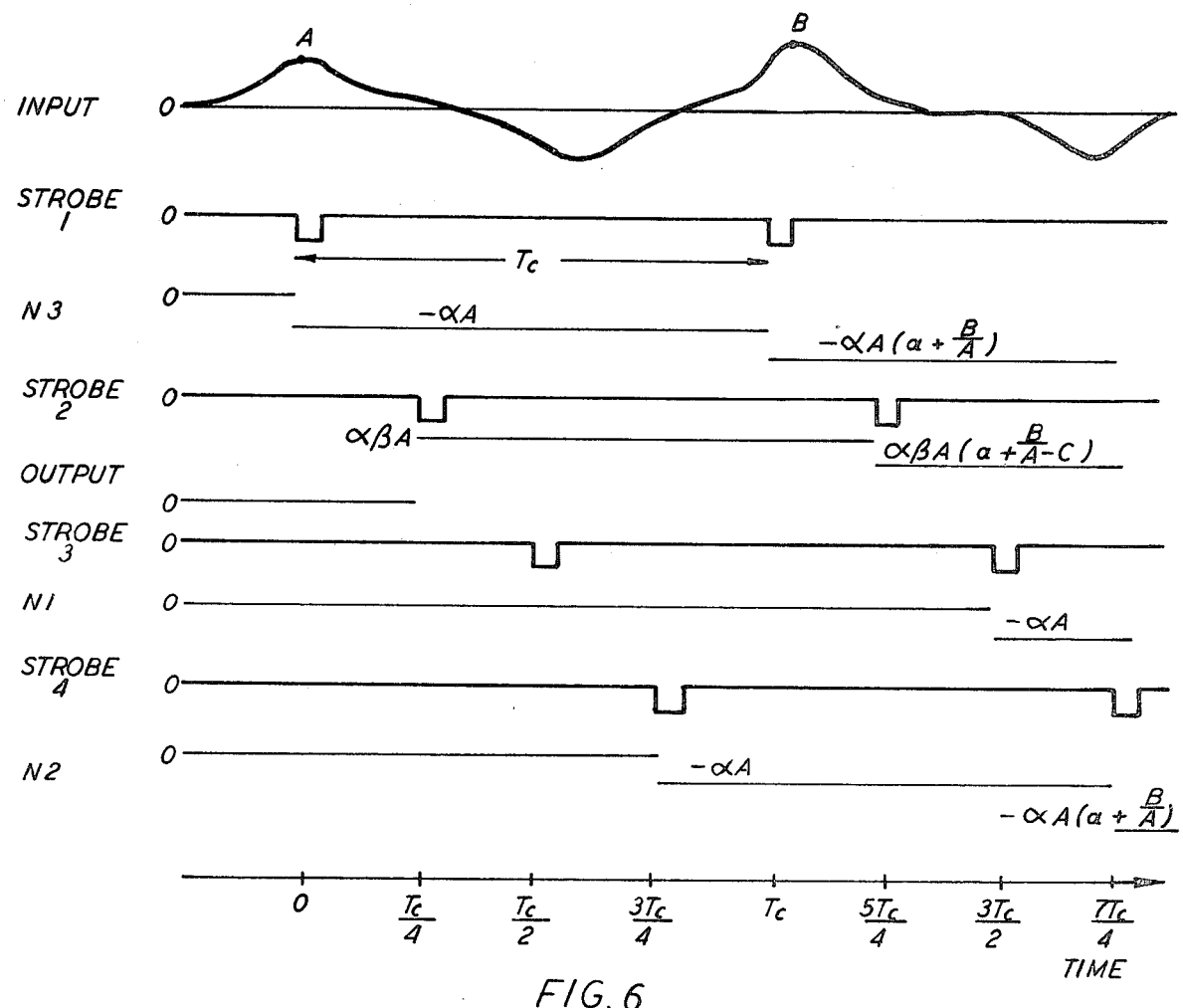
FIG. 6 is a timing diagram useful in explaining the filter of FIG. 2.

The following is a description of the operation of the filter of the present invention utilizing the wave forms shown in FIG. 6 and schematic of FIG. 1.

Assume all node voltages, $N_1$, $N_2$, $N_3$ and the output are initially at zero.

At time $t=0$, strobe 1 occurs causing the input sample voltage A, scaled by $-\alpha$ due to amplifier 12, to appear at the output of sample-and-hold circuit 21.

At time $t=T_c/4$, one quarter of a carrier period later, strobe 2 samples the output of sample and hold circuit 24. The output voltage will be $\alpha\beta A$ since node voltage $N_3$ is held at $-\alpha A$ but scaled by $\beta$ due to amplifier 15. The voltages $N_1$ and $N_2$ are still zero so that they do not contribute to the output at this time.

At time $t=T_c/2$, strobe 3 samples sample-and-hold 23 and produces no output at node voltage $N_1$ since node voltage $N_2$ is still zero. The need to sample sample-and-hold circuit 23 before sample-and-hold circuit 22 is so that the unit delays of the signal will proceed from left to right.

At time $t=\frac{3}{4}T_c$, strobe 4 causes the output of sample-and-hold circuit 22, node $N_2$ to obtain node voltage $N_3$, the previous output of sample-and-hold circuit 21, i.e., $-\alpha A$. Note that although the outputs of amplifier 12 and 15 are changing during strobes 3 and 4 there are no changes in node voltages $N_3$ and the output because the sample and hold circuits 21 and 24, respectively, are open.

At time $t=T_c$, one carrier period later, strobe 1 input occurs again. This time amplifier 12 sees a new input sample voltage B, voltage A at the output of amplifier 13, as well as zero volts due to node $N_1$ from previous cycle. Consequently, the output of sample and hold circuit 21 or node $N_3$ is $-\alpha$ times the sum of the new sample voltage B plus $aA$ due to resistor $Ra^{-1}$. This sum is $-\alpha A(a+B/A)$ which for the case shown is more negative then $-\alpha A$ since $B>A>0$.

At time $t=(5/4)T_c$, strobe 2 again appears producing an updated output which is $-\beta$ times the weighted sum of voltages $N_1$, $N_3$, and $-N_2$. The latter sign differing because of amplifier 14. The corresponding weights are d, 1, and c due to their associated resistors. Consequently, the output becomes $A(a+[B/A]-c)$. Now for the case shown B A. But when $B=A$, implying no data change in the input signal, if $c=a$ then the output is caused to stay constant, which indicates that the carrier has been rejected completely. Thus, for any data input the output will only yield the input signal quantized, but with no carrier present.

The relation for the coefficients to obtain no carrier is not exactly $c=a$ because the example has not reached a steady state yet. The actual relation is close however, and was obtained by Z- transform method of signal processing in the design example section (see eq. 9).

Strobe pulses 3 and 4 at times $t=(3/2)T_c$ and $(7/4)T_c$ simply relay the voltages N2 and N3 into voltages N1 and N2, respectively. Thus, the output of N1 is the input scaled and delayed by two clock cycles, whereas the output of N2 contains the input delayed by one cycle plus the input delayed by two cycles. These delays imply memory so that the addition of input with itself delayed appropriately can result in a null or filtered output.

The present invention is an active RC filter. However, instead of having a fixed bandreject, its bandreject is automatically variable with the input frequency. Sampling and the use of sample and hold circuits makes this possible. An analogous circuit might be an RC circuit where the capacitor or capacitors in the circuit were variable in accordance with the outside signal to be filtered. The variable capacitors would produce the necessary variable phase lags and leads to effect signal cancellation. For the present circuit herein, the use of a variable clock frequency causes the same necessary phase lag and lead for cancellation thereby negating the need for variable capacitors.

As mentioned above, the present invention was illustrated using a specific set of parameters. The notch is variable within limits. The upper frequency limit is half the sampling frequency which is one fourth the maximum clock frequency permitted. The lower limit is d.c.

In addition, other types of filters, e.g., low pass, high pass and band pass may be obtained by changing the resistor values in accordance with filter coefficients. Tables I, II and III are included below to show the flexibility of the present invention.

TABLE I

FILTER PARAMETERS, COEFFICIENTS, AND CONTROLLING RESISTORS

| Filter Parameter | Controlling Coefficient | Controlling Resistor |
|---|---|---|
| Natural Frequency, $f_n$ | b | $Rb^{-1}$ |
| Quality, Q | a | $Ra^{-1}$ |
| Notch Frequency, $f_o$ | d | $Rd^{-1}$ |

TABLE II

Z-DOMAIN TRANSFER FUNCTIONS

| Filter Type | H(Z) |
|---|---|
| Low Pass | $\dfrac{0.1262}{Z^2 - 1.549Z + 0.6752}$ |
| High Pass | $\dfrac{Z^2 - 2Z + 1}{Z^2 - 1.549Z + 0.6752}$ |
| Bandpass | $\dfrac{-0.3195(Z - 1)*}{Z^2 - 1.549Z + 0.6752}$ |
| Bandreject | $\dfrac{Z^2 - 1.848Z + 1}{Z^2 - 1.549Z + 0.6752}$ |
| All Pass | $\dfrac{Z^2 - 2.295Z + 1.481}{Z^2 - 1.549Z + 0.6752}$ |

*NOTE: An additional 180° of phase shift is added to utilize existing hardware.

TABLE III

RESISTOR VALUES FOR FILTER TYPES

| Type | $Ra^{-1}$ | $Rb^{-1}$ | $Rc^{-1}$ | $Rd^{-1}$ | $R\alpha^{-1}$ | R | $Re^{-1}$ |
|---|---|---|---|---|---|---|---|
| Low Pass | 6.46 K | 14.8 K | ∞ | 10 K | 10 K | 1.26 K | ∞ |
| High Pass | 6.46 K | 14.8 K | 5 K | 10 K | 10 K | 10 K | 10 K |
| Bandpass | 6.46 K | 14.8 K | 10 K | 10 K | 10 K | 3.20 K | ∞ |
| Bandreject | 6.46 K | 14.8 K | 5.41 K | 10 K | 10 K | 8.31 K | 10 K |

Other modifications of the present invention are possible in light of the above description which should not be construed as limiting the invention beyond the limitations set forth in the claims which follow:

What is claimed is:

1. A circuit for eliminating a variable carrier frequency from an input data signal, comprising in combination,
    filter means automatically tunable to provide a variable frequency reject band comprising first, second, third and fourth sample-and-hold circuits connected in tandem,
    input means providing said input data signal to said first sample-and-hold circuit,
    first means automatically tuning said filter means to vary the frequency reject band in accordance with variations in the carrier frequency to eliminate the carrier frequency from the input data signal,
    said first means comprising strobe pulse generating means,
    said strobe pulse generating means including second means causing the period of the strobe pulses to vary proportionately to variations in the carrier frequency,
    third means connecting said strobe pulse generator means to said filter means to cause said first, second, third and fourth sample-and-hold circuits to be strobed first, fourth, third and second, respectively.

2. A circuit according to claim 1 including,
    first differential amplifier means,
    negative feedback circuit means connected between the output of said third sample-and-hold circuit and the inverting input of said first differential amplifier means,
    positive feedback circuit means connected between the output of said second sample-and-hold circuit and the inverting input of said first differential amplifier means,
    second differential amplifier means connected between said third and fourth sample-and-hold circuits;
    first feedforward circuit means connected between the output of said second sample-and-hold circuit and the inverting input of said second differential amplifier means,
    second feedforward circuit means connected between the output of said first sample-and-hold circuits and the inverting input of said second differential amplifier means.

3. A circuit according to claim 2 wherein,
    each of said positive feedback circuit means and said first feedforward circuit means includes an inverter, and,
    said second differential amplifier means includes a negative feedback circuit.

4. A circuit according to claim 3 wherein said strobe pulse generating means comprises,
    a phase locked loop connected to receive the input data signal and providing a clock pulse output proportional to the frequency of said carrier frequency,
    first, second, third and fourth AND gates,
    a shift register having four output terminals each of which is connected to a respective one of said first, second, third and fourth AND gate,
    means connecting the clock pulse output of said phase locked loop to said shift register and each of said first, second, third and fourth AND gates,
    fifth AND gate means having an output connected to said shift register,
    divider means connected between the output of said phase locked loop and said fifth AND gate providing first and second inputs to said fifth AND gate equal to one half and one fourth of the clock pulse frequency, respectively.

5. A circuit according to claim 4, wherein each of said sample and hold circuit means comprises,
    a normally open field effect transistor having a gate electrode connected to receive one of said strobe pulses and a source electrode,
    a capacitor connected between ground and the drain electrode of said field effect transistor whereby said capacitor is charged or discharged to the level of voltage at the source electrode whenever said field effect transistor is closed by a strobe pulse.

6. A circuit for eliminating a variable carrier frequency from an input data signal, comprising in combination,
    filter means automatically tunable to provide a variable frequency reject band comprising first, second, third and fourth sample-and-hold circuits connected in tandem,
    input means providing said input data signal to said first sample-and-hold circuit,
    first means automatically tuning said filter means to vary the frequency reject band in accordance with variations in the carrier frequency to eliminate the carrier frequency from the input data signal,
    said first means comprising strobe pulse generating means for providing strobe pulses to sample each of said sample-and-hold circuit in a predetermined sequence,
    said strobe pulse generating means including second means causing the period of the strobe pulses to vary proportionately to variations in the carrier frequency,
    first differential amplifier means,
    negative feedback circuit means connected between the output of said third sample-and-hold circuit and the inverting input of said first differential amplifier means,
    positive feedback circuit means connected between the output of said second sample-and-hold circuit and the inverting input of said first differential amplifier means,
    second differential amplifier means connected between said third and fourth sample-and-hold circuits;
    first feedforward circuit means connected between the output of said second sample-and-hold circuit and the inverting input of said second differential amplifier means,
    second feedforward circuit means connected between the output of said first sample-and-hold circuit and the inverting input of said second differential circuit amplifier means.

* * * * *